United States Patent
Watanabe et al.

(12) United States Patent (10) Patent No.: US 6,911,065 B2
(45) Date of Patent: Jun. 28, 2005

(54) METHOD AND SYSTEM FOR SUPPLYING HIGH PURITY FLUID

(75) Inventors: Tadaharu Watanabe, Superior, CO (US); Robert Torres, Jr., Parker, CO (US); Joseph Vininski, Denver, CO (US)

(73) Assignee: Matheson Tri-Gas, Inc., Longmont, CO (US)

( * ) Notice: Subject to any disclaimer, the term of this patent is extended or adjusted under 35 U.S.C. 154(b) by 138 days.

(21) Appl. No.: 10/331,123

(22) Filed: Dec. 26, 2002

(65) Prior Publication Data

US 2004/0123735 A1 Jul. 1, 2004

(51) Int. Cl.⁷ .............................................. B01D 53/04
(52) U.S. Cl. .............................. 95/90; 95/115; 95/116; 95/131; 95/133; 95/135; 95/138; 95/139; 95/140; 95/143; 96/112; 96/135; 96/138; 96/143; 96/151; 96/153; 55/385.4
(58) Field of Search ............................... 95/90, 95, 104, 95/106, 115, 116, 131–140, 143; 96/108, 112, 134–136, 138–144, 151–154; 55/385.4

(56) References Cited

U.S. PATENT DOCUMENTS

| | | | | |
|---|---|---|---|---|
| 2,284,147 A | * | 5/1942 | Herrick | 436/29 |
| 2,504,184 A | * | 4/1950 | Dawson | 96/136 |
| 2,671,526 A | * | 3/1954 | Gilbert et al. | 96/117.5 |
| 3,246,758 A | * | 4/1966 | Wagner | 210/94 |
| 4,603,148 A | * | 7/1986 | Tom | 521/31 |
| 4,659,552 A | * | 4/1987 | Tom | 423/219 |
| 4,723,967 A | * | 2/1988 | Tom | 95/90 |
| 4,738,693 A | * | 4/1988 | Tom | 95/90 |
| 4,983,363 A | * | 1/1991 | Tom et al. | 422/180 |
| 5,340,552 A | | 8/1994 | Snow | |
| 5,409,526 A | | 4/1995 | Zheng et al. | |
| 5,470,555 A | | 11/1995 | Shimada et al. | |
| 5,851,270 A | * | 12/1998 | Olander | 96/144 |
| 5,916,245 A | * | 6/1999 | Tom | 62/46.1 |
| 5,980,608 A | * | 11/1999 | Dietz et al. | 95/12 |
| 5,997,616 A | * | 12/1999 | Ledru et al. | 96/113 |
| 6,007,609 A | * | 12/1999 | Semerdjian et al. | 96/108 |
| 6,019,823 A | * | 2/2000 | Tischler et al. | 96/108 |
| 6,027,547 A | * | 2/2000 | Tom et al. | 95/96 |
| 6,309,446 B1 | * | 10/2001 | Nakanoya et al. | 95/102 |
| 6,592,653 B2 | * | 7/2003 | Wang et al. | 95/131 |
| 6,660,063 B2 | * | 12/2003 | Tom et al. | 95/90 |
| 2002/0112608 A1 | * | 8/2002 | Irven et al. | 96/108 |
| 2003/0126991 A1 | * | 7/2003 | Wang et al. | 96/108 |
| 2003/0192430 A1 | * | 10/2003 | Pearlstein et al. | 95/90 |

* cited by examiner

Primary Examiner—Robert H. Spitzer
(74) Attorney, Agent, or Firm—Kent A. Lembke; Hogan & Hartson L.L.P.

(57) ABSTRACT

A fluid purifying apparatus that includes a manifold that includes a first branch and a second branch, a first check valve coupled to the first branch of the manifold, and a purifier unit that includes a first end and a second end, wherein the first end is coupled to the second branch of the manifold. Also, a fluid purifying apparatus that includes a vessel that includes a first interior compartment for containing a purifier material and a second interior compartment for containment of a fluid containing impurities, wherein the first interior compartment is separated from the second interior compartment by a fluid permeable support, and a rupturable seal.

56 Claims, 8 Drawing Sheets

METHOD AND SYSTEM FOR SUPPLYING HIGH PURITY FLUID

BACKGROUND OF THE INVENTION

1. Field of the Invention

This invention relates to the field of fluid purification, and to the purification of inert, non-reactive and reactive fluids. Furthermore, the invention relates to methods and materials for selectively removing trace amounts of impurities from inert, non-reactive and reactive fluids.

2. Description of the Prior Art

The provision of high purity fluid streams is critically important in a wide variety of industrial and research applications. The rapid expansion of vapor-phase processing techniques, e.g., chemical vapor deposition, in the semiconductor industry has been associated with the deployment and use of manufacturing equipment that is totally reliant on the delivery of high purity process fluids at the point of use in the semiconductor manufacturing facility.

Considering the impurities which ate present in fluid streams involved in semiconductor manufacturing, it is to be noted that the growth of high quality thin film electronic and optoelectronic cells by chemical vapor deposition or other vapor-based techniques is inhibited by a variety of low-level process impurities. These impurities can cause defects that reduce yields by increasing the number of rejects, which can be very expensive. These impurities may be particulate or chemical contaminants.

Chemical impurities may originate in the production of the source fluid itself, as well as in its subsequent packaging, shipment, storage, and handling. Although source fluid manufacturers typically provide analyses of source gas materials delivered to the semiconductor manufacturing facility, the purity of the fluids may change because of leakage into or outgassing of the containers, e.g., gas cylinders, in which gases are packaged. Impurity contamination may also result from improper fluid containers changes, leaks into downstream processing equipment, or outgassing of such downstream equipment.

In semiconductor manufacturing processes, for example, removal of impurities helps to ensure the production of high-quality, high-performance semiconductor chips. Such impurities, when introduced onto the semiconductor chip during its manufacture, tend to render the chip deficient or even useless for its intended purpose. Thus, a growing number of industries are now requiring fluids having impurity concentrations that do not exceed about 10 parts-per-billion (ppb) levels;

For example, in the manufacture of III–V semiconductor devices using metal-organic chemical vapor deposition (MOCVD), Group IIIA organometallic source gases, such as tri-methyl aluminum, tri-methyl indium and tri-methyl gallium may be purified by fractional distillation and/or sublimation to remove impurities. These organometallic compounds are highly reactive with oxygen, and form oxygenated impurities that can significantly degrade the performance of III–V semiconductor devices.

There remains a need in the art for a reagent that removes contaminants such as oxygen and water from inert, non-reactive and reactive fluids. Further, there remains a need for purification methods and apparatuses that provide relatively fast equilibration between fluid and purifier to ensure adequate concentrations of purified fluid can be provided at the point of use. Also, a need exists for purifier materials that remove oxygen and oxygenated species and other impurities from inert, non-reactive and reactive fluids without concurrently emitting contaminants such as moisture into the purified fluid stream.

SUMMARY OF THE INVENTION

One embodiment of the invention includes a fluid purifying apparatus comprising a vessel comprising a first interior compartment for containing a purifier material and a second interior compartment for containing a fluid having impurities, wherein the first interior compartment is separated from the second interior compartment by a fluid permeable support. In another embodiment, a membrane is provided between the fluid and fluid permeable support, wherein the membrane prevents the fluid from contacting the purifier until the membrane is broken.

Another embodiment of the invention includes a fluid purifying apparatus comprising a first container comprising a first fitting and a purifier material, a second container comprising a second fitting and a fluid to be purified, and a seal member interposed between the first fitting and the second fitting when the first container is coupled to the second container, wherein the seal member comprises an inner membrane that separates the fluid to be purified from the purifier material until the inner membrane is broken.

Another embodiment of the invention includes a fluid purifying apparatus comprising a manifold comprising a first branch and a second branch, a first check valve coupled to the first branch of the manifold, and a purifier unit comprising a first end and a second end, wherein the first end is coupled to the second branch of the manifold.

Another embodiment of the invention includes a fluid purifying apparatus comprising a fluid vessel comprising a vessel valve, a purifier unit positioned outside of said fluid vessel, wherein said purifier unit comprises a first opening and a second opening, said first opening coupled to the vessel valve and said second opening coupled to a point of use for purified fluid, and a temperature control device thermally coupled to the fluid vessel and the purifier unit.

Another embodiment of the invention includes a method of purifying a fluid comprising providing a vessel comprising a first interior compartment and a second interior compartment, wherein the first interior compartment is separated from the second interior compartment by a fluid permeable support; providing a purifier in the first interior compartment and a fluid in the second interior compartment; breaking a membrane that prevents the fluid from contacting the purifier; and passing the fluid through the fluid permeable support and the purifier to remove impurities from the fluid.

Additional novel features shall be set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

Figure 1:
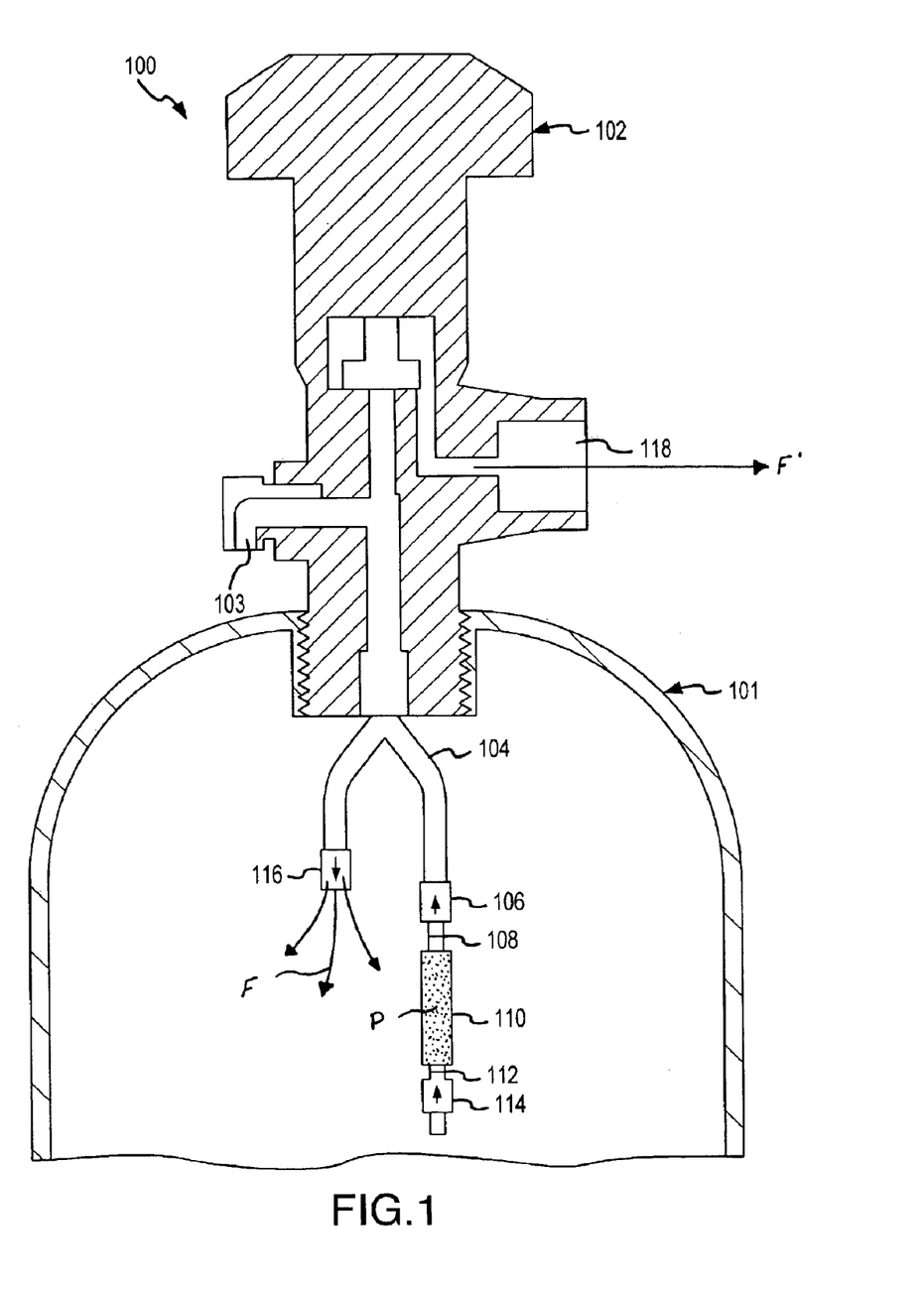
FIG. 1 shows a fluid storage and purification apparatus 100 according to one embodiment of the invention.

The fluid purifying apparatus 100 of the invention is illustrated by FIG. 1 and comprises a branched manifold 104 that is positioned inside a fluid storage vessel 101 and operatively engaged to a vessel valve 102 that receives fluids F and dispenses purified fluids F' from the vessel 101. The individual elements of apparatus 100, such as the vessel 101, vessel valve 102, manifold 104, purifier unit 110, filter gaskets 108 and 112, and check valves 106, 114 and 116 will be discussed in further detail below. This branched manifold purifying apparatus 100 allows a user to introduce fluid F into storage vessel 101 through a branch of manifold 104 that terminates with check valve 116. The fluid F introduced to storage vessel 101 is then purified as it flows from storage vessel 101, through check valve 114, and into purifier unit 110 where impurities are removed by purifier material P located within purifier unit 110. The purified fluid F' is dispensed from vessel valve 102 after exiting purifier unit 110 through check valve 106 that is coupled to another branch of manifold 104.

Referring now to the details of apparatus 100 illustrated by FIG. 1, the apparatus 100 includes a manifold 104 positioned inside a fluid vessel 101 and operatively engaged to a valve 102 that is coupled to the vessel 101. Valve 102 is a conventional gas cylinder valve that has an outlet 118 and a safety device 103. Safety device 103 is fitted with a metal burst disk (not shown) that ruptures when the pressure in the fluid vessel exceeds a safe level. The metal burst disk comprises a fusible and/or meltable metal.

Manifold 104 has two branches: One branch terminates with a first check valve 116 that is biased to allow fluid F to flow from manifold 104 into vessel 101, but resists flow in the opposite direction (i.e., from vessel 101 into manifold 104). The other branch of manifold 104 is coupled to a second check valve 106, which in turn is coupled to purifier unit 110. Check valve 106 is biased to allow fluid F' to flow from purifier unit 110 to manifold 104, but resists letting fluid F flow in the opposite direction (i.e., from manifold 104 to purifier unit 110).

A filter gasket 108 is positioned between check valve 106 and purifier unit 110 to prevent particulate materials from clogging manifold 104 and valve 102. Filter gasket 108 has an outer portion and an inner mesh: The outer portion engages both check valve 106 and purifier unit 110 to leak-tightly couple these elements together, and the inner mesh traps purifier material P and other particulates in purifier unit 110 while permitting fluid F' to pass to check valve 106.

A third check valve 114 is coupled to purifier unit 110 opposite the end where check valve 106 couples to purifier unit 110. Check valve 114 has the same flow bias direction as check valve 106 and allows fluid F to flow from storage vessel 101 to purifier unit 110, but resists flow in the opposite direction. Check valve 114 also keeps fluid F from flowing into purifier unit 110 until valve 102 is opened.

Another filter gasket 112 is positioned between check valve 114 and purifier unit 110 to prevent particulate materials from entering purifier unit 110 and also to hold the purifier materials P inside purifier unit 110. Similar to filter gasket 108, filter gasket 112 has an outer portion and an inner mesh: The outer portion engages both purifier unit 110 and check valve 114 to leak-tightly couple these elements together. The inner mesh prevents particulate material in the fluid from entering purifier unit 110 and holds the purifier material P inside the unit 110, while letting the fluid F pass into the unit 110.

Optionally, rupturable burst disks (not shown) leak-tightly seal purifier unit 110 until a user is ready to dispense purified fluid F' to a point of use. The burst disks have an outer ring portion that is sealingly coupled to an end of purifier unit 110, and a rupturable inner membrane that leak-tightly seals that end of purifier unit 110 until the membrane is ruptured.

The fluid purifying apparatus 100 described above allows a user to introduce fluid F that contains impurities through manifold 104 and check valve 116 and into vessel 101 where fluid F is stored until needed. When purified fluid F' is needed, the user opens valve 102 and the stored fluid F flows through check valve 114 and purifier unit 110 where impurities are removed by purifier material P in purifier unit 110.

When the pressure of fluid F alone is inadequate to force the fluid F through the purifier unit 110, the user can add a carrier gas. The flow rate for fluid F (or fluid F and carrier gas) can range from about 0.001 standard liters per minute ("splm") to about 1000 splm, and can also range from about 1 splm to about 200 splm. If burst disks seal purifier unit 110, the pressure of fluid F (or a combination of fluid F and a carrier gas) ruptures the inner membrane of the disks to allow fluid F to enter the purifier unit 110. The purified fluid F' then exits the purifier unit 110 and travels through check valve 106 and manifold 104 before being dispensed to the point of use through an opening 118 in valve 102.

Fluid F includes liquids, gases, vapors, and multi-phase fluids (e.g., single component fluids and mixtures). Examples of fluid F include, without being limited to, halogen containing compounds such as fluorine ($F_2$); chlorine ($Cl_2$); bromine ($Br_2$); iodine ($I_2$); hydrogen fluoride (HF); hydrogen chloride (HCl); hydrogen bromide (HBr); hydrogen iodide (HI); nitrogen trifluoride ($NF_3$); tungsten hexafluoride ($WF_6$); silicon halide compounds such as dicholorosilane ($SiH_2Cl_2$), trichlorosilane ($SiHCl_3$), silicon tetrafluoride ($SiF_4$), silicon tetrachloride ($SiCl_4$); sulfur hexafluoride ($SF_6$); chlorine trifluoride ($ClF_3$); boron trichloride ($BCl_3$); boron trifluoride ($BF_3$); arsenic pentafluoride ($AsF_5$); germanium tetrafluoride ($GeF_4$); phosphorous trifluoride ($PF_3$); and halocarbons such as $CF_4$, $NF_3$, $CHClF_2$, $CClF_2CF_3$, $CClF_3$, $CHCl_2F$, $CH_2F_2$, and $CH_3F$, among other halogen containing compounds.

Examples of fluid F also include organic compounds such as saturated and unsaturated hydrocarbons including alkanes, alkenes and alkynes; cyclic hydrocarbons including bicyclic and polycyclic ring compounds; aromatic hydrocarbons including arenes and heteroarenes; oxygenated organic compounds including alcohols, ethers, ketones, esters, and organic acids, among other oxygenated organic compounds; and nitrogen containing organic compounds including amines, among other organic compounds.

Examples of fluid F further include hydrogen containing compounds, such as hydrogen ($H_2$); ammonia ($NH_3$); silane ($SiH_4$); disilane ($Si_2H_6$); arsine ($AsH_3$); phosphine ($PH_3$);

germane (GeH$_4$); diborane (B$_2$H$_6$); and SeH$_2$ among other hydrogen containing compounds. Fluid F also includes, for example, oxygen containing compounds such as oxygen (O$_2$); carbon monoxide (CO); carbon dioxide (CO$_2$); nitrogen oxide (NO); nitrous oxide (N$_2$O); nitrogen dioxide (NO$_2$); and carbonyl sulfide (COS), among other oxygen containing compounds. Fluid F further includes, for example, inert compounds such as nitrogen (N$_2$); helium (He); argon (Ar); neon (Ne); krypton (Kr); xenon (Xe); and radon (Rn), among other inert compounds.

Examples of fluid F also include, organometallic compounds comprising a metal and at least one organic group. Examples of the metal include alkali metals, alkali earth metals, transition metals such as Group IIIA, IVA, VA, VIA, VIIA, VIII, Ib and IIb, and the Group IIIb, IVb, Vb, VIb metals (where the Group designation are defined by the Chemical Abstracts Service periodic table group notation). The metal may also include polymetallic groups of two or more metals in the organometallic compound. Examples of the organic group include linear, cyclic and aromatic hydrocarbons that are unsubstituted, and those that have substituted constituent groups such as alkyl hydrazines, arenes, heteroarenes, thiols, amines, alcohols, ethers, ketones, and carboxylic acids. Specific examples of organometallic compounds used with the present invention include alkyl amine-alanes, tri-alkyl aluminum compounds, tri-alkyl gallium compounds, and tri-alkyl indium compounds, where the alkyl group comprises a methyl group, an ethyl group, a propyl group, etc.

Sometimes a carrier gas is used in addition to fluid F to dilute the concentration of fluid F and/or help fluid F flow through the purifying apparatus and reach a point of use. Examples of carrier gas include, without being limited to, hydrogen (H$_2$) and inert gases such as nitrogen (N$_2$); helium (He); argon (Ar); neon (Ne); krypton (Kr); and xenon (Xe), among other carrier gases.

Purifying materials P that purify fluid F include substrates and substrates combined with metal compounds. The substrates may have a variety of forms such as beads, sheets, extrudates, powders and tablets, among other forms. The surface area of the substrate can have a range from about 0.1 m$^2$/g to about 1000 m$^2$/g. Alternatively, the surface area can have a range from about 1 m$^2$/g to about 300 m$^2$/g, or can have a range from about 10 m$^2$/g to about 100 m$^2$/g. The pore size of the substrate can be about 0.1 nm or larger in size. Alternatively, the pore size can be 2 nm or larger in size, or range from about 0.1 nm to about 10 nm.

Examples of substrates used as purifying materials P include, without being limited to, metal oxides such as alumina (Al$_2$O$_3$); silica-alumina; silica (SiO$_2$); titania (TiO$_2$); zirconia (ZrO$_2$); and zeolites, among other metal oxides. Examples also include carbon, graphite, and organic polymers.

Metal compounds used in the purifying materials P can cover substantially all the surface of the substrate. Alternatively, the metal compounds can cover a range from about 5% to about 100% of the surface, or about 90% of the surface of the substrate. The metal compounds can act as the substrate itself, in which case the metal compound makes up 100% of the surface of purifying material P. Examples of metal compounds used in purifying materials P include, without being limited to, metals such as aluminum, magnesium, titanium, zinc, lithium, sodium, vanadium, chromium, molybdenum, tungsten, manganese, lead, bismuth, cobalt, tungsten, cerium, nickel, copper and iron, as well as alloys of the metals. Examples of the metal compounds also include oxides, nitrates, carbonates, oxalates, and hydrides of these metals.

As noted above, impurities are removed from fluid F by the fluid purifying apparatus of the present invention. Examples of the impurities include, without being limited to, oxygen containing compounds such as oxygen containing organic and inorganic compounds, oxygen, water, hydroxides, peroxides, carbonates, carbon monoxide, carbon dioxide, ethers, alcohols, alkoxides, and alkyletherates adducts, among others. Examples of the impurities I also include sulfates, sulfites, thiosulfates, phosphates, nitrates, nitrites, halides, chalcides, and oxy-halides, among others.

When the impurities are removed from fluid F, the fluid F is considered to be a "purified" fluid F'. It is to be understood that the terms "purified," "pure" and "impure" are relative and not absolute terms. For example, commercially available argon having 500 ppb of impurities can hardly be considered heavily contaminated. Therefore, as used herein, "purified" fluids are those fluids that meet the purity specifications for a given process, and "impure" fluids are those fluids that do not meet those purity specifications.

The concentrations of impurities in purified fluid F' can include a range of from about 100 parts per billion ("ppb") to about 0.01 ppb. Alternatively, the concentration can be about 10 ppb or less, 1 ppb or less, or 0.1 ppb or less.

Figure 2:
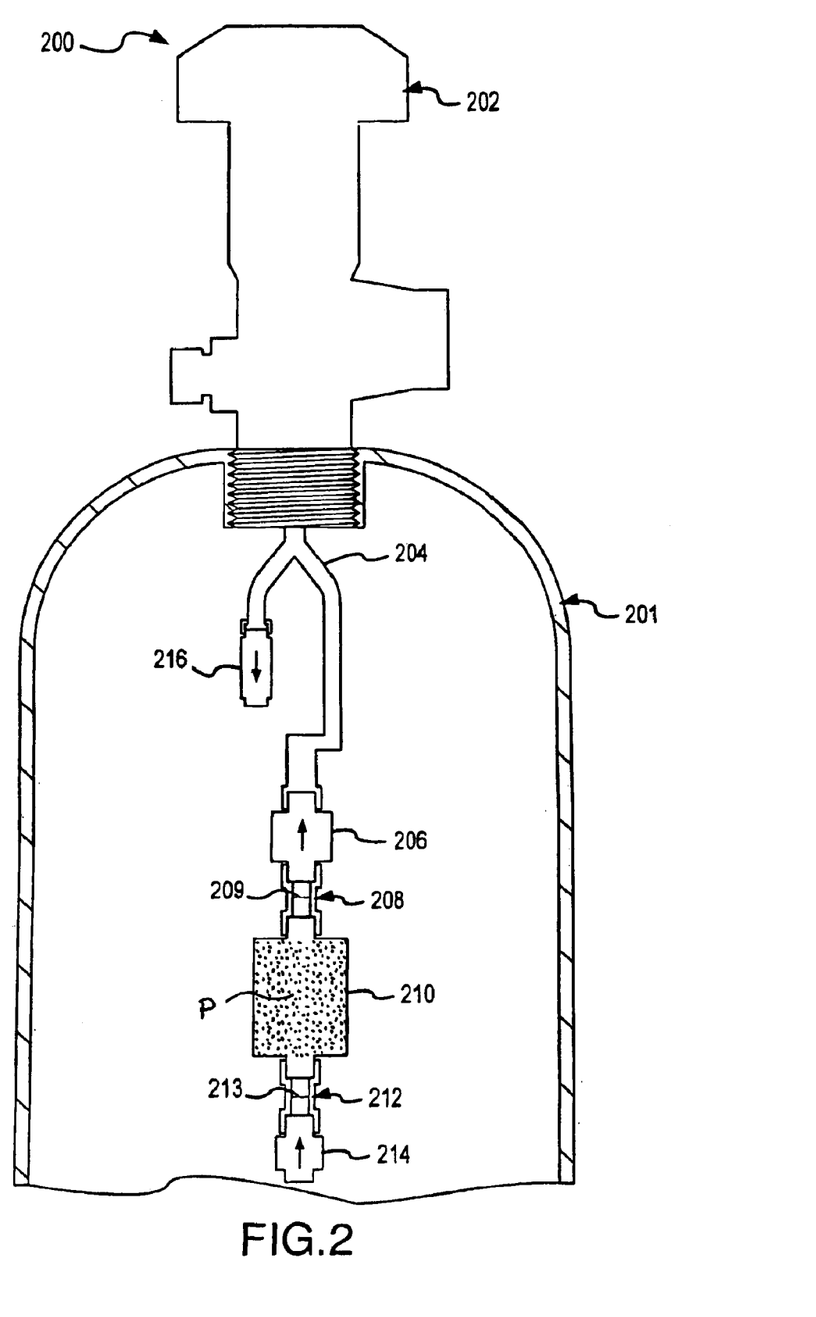
FIG. 2 shows a fluid storage and purification apparatus 200 according to another embodiment of the invention.

Another embodiment of a fluid purifying apparatus 200 of the invention is illustrated by FIG. 2 and comprises a branched manifold 204 that is positioned inside a fluid storage vessel 201 and operatively engaged to a vessel valve 202 that receives fluids F and dispenses purified fluids F' from the vessel 201. In this embodiment, unions 208 and 212 are used to couple the check valves 206 and 214 to the purifier unit 210.

Referring now to the details, the apparatus 200 includes a manifold 204 positioned inside a fluid storage vessel 201 and operatively engaged to a valve 202 that is coupled to storage vessel 201. Manifold 204 has two branches: One branch terminates with a first check valve 216 that is biased to allow fluid F to flow from manifold 204 into storage vessel 201, but resists flow in the opposite direction (i.e., from vessel 201 into manifold 204). The other branch of manifold 204 is coupled to a second check valve 206, which is biased to allow fluid F to flow from purifier unit 210 to manifold 204, but resists letting fluid F flow in the opposite direction (i.e., from manifold 204 to purifier unit 210).

A first union 208 is used to couple check valve 206 to purifier unit 210. Union 208 comprises a first end and a second end opposite the first, where the first end sealingly engages check valve 206 and the second end sealingly engages purifier unit 210. A filter gasket 209 is aligned co-axially with and positioned approximately in the middle of union 208 to prevent particulate materials from clogging manifold 204 and valve 202. Alternatively, the filter gasket can be positioned at approximately the first or second end of the union 208. Filter gasket 209 traps purifier material P and other particulates in the purifier unit 210 while permitting fluid F to pass to check valve 206.

A third check valve 214 is coupled to purifier unit 210 opposite the end where check valve 206 couples to purifier unit 210. Check valve 214 has the same flow bias direction as check valve 206 and allows fluid F to flow from the vessel 201 to the purifier unit 210, but resists flow in the opposite direction. Check valve 214 also keeps fluid F from flowing into purifier unit 210 until valve 202 is opened.

A second union 212 is used to couple check valve 214 to purifier unit 210. Union 212 comprises a first end and a second end opposite the first, where the first end sealingly engages the purifier unit 210 and the second end sealingly engages check valve 214. A filter gasket 213 is aligned co-axially with and positioned approximately in the middle of union 212. Alternatively, the filter gasket can be positioned at approximately the first or second end of the union 212. The filter gasket 213 prevents particulate material in fluid F from entering purifier unit 210 and holds the purifier material P inside the unit 210, while letting fluid F pass into purifier unit 210.

Optionally, the unions 208 and 212 include rupturable burst disks (not shown) aligned co-axially with and coupled to the unions 208 and 212. The burst disks leak-tightly seal purifier unit 210 until a user is ready to dispense purified fluid F' to a point of use. The burst disks include a rupturable membrane that leak-tightly seals an end of purifier unit 210 until the membrane is ruptured.

Figure 3:
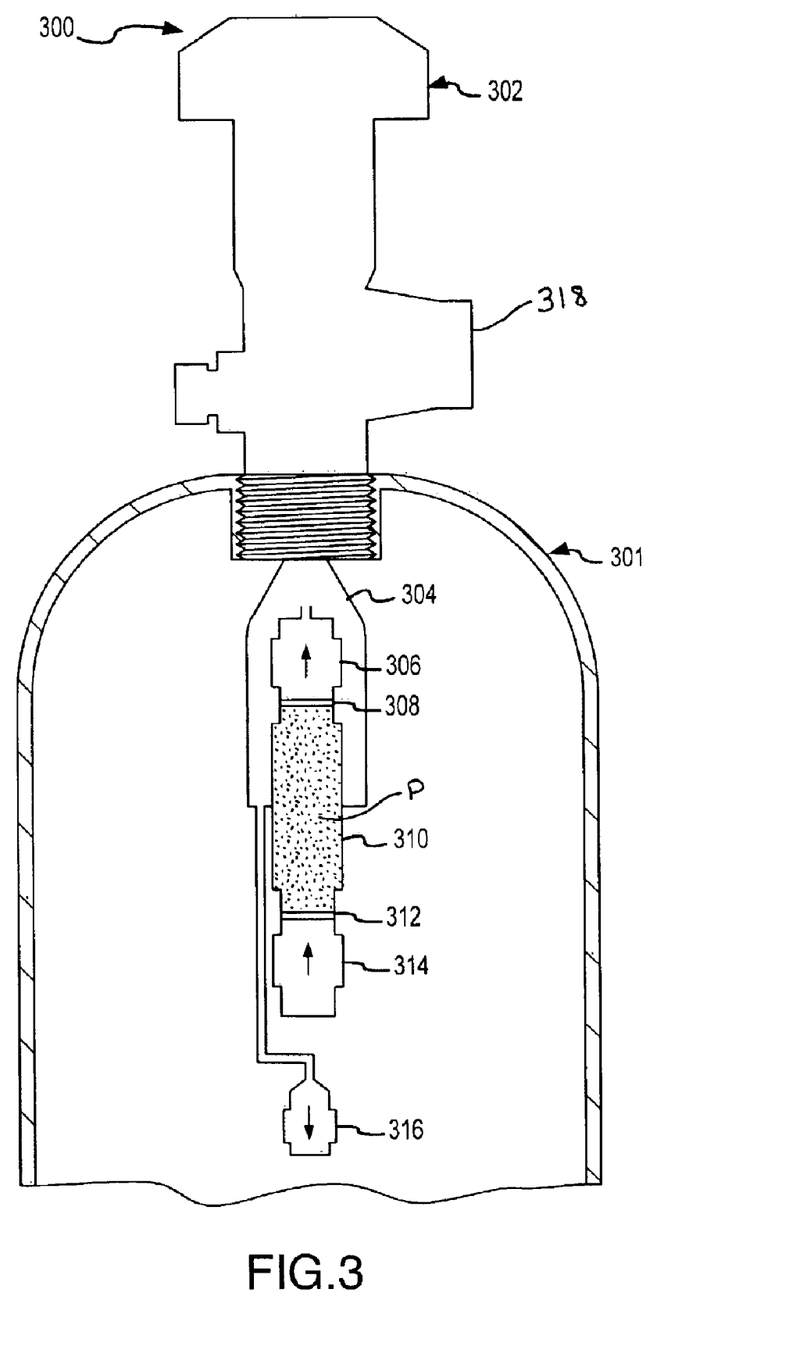
FIG. 3 shows a fluid purification apparatus 300 according to another embodiment of the invention.

Another embodiment of a fluid purifying apparatus 300 of the invention is illustrated by FIG. 3 and comprises a chamber 304 that is positioned inside a fluid storage vessel 301 and operatively engaged to a vessel valve 302 that receives fluids F and dispenses purified fluids F' from the vessel 301. In this embodiment, a check valve 306 and a portion of the purifier unit 310 are positioned inside the chamber 304, which also includes a port 318 that is coupled to another check valve 316. A user introduces fluid F to storage vessel 301 by coupling a source of fluid F to valve 302. When the user opens valve 302, fluid F will flood chamber 304 and pass through port 318 and check valve 316 into storage vessel 301. When the user is ready to dispense purified fluid F' from the vessel 301, the fluid F stored in storage vessel 301 passes through check valve 314 into purifier unit 310 where purifier material P removes impurities from fluid F. Then, purified fluid F' passes through check valve 306 into chamber 304 where it is dispensed through open valve 302 to the point of use.

Filter gaskets 308 and 312 are aligned co-axially with and positioned at opposite ends of purifier unit 310. Similar to filter gaskets in other embodiments of the invention, these filter gaskets 308 and 312 prevent particulate materials from entering purifier unit 310 and chamber 304 while also holding purifier materials P inside purifier unit 310. The purifier apparatus 300 also optionally includes burst disks (not shown) that leak-tightly seal the purifier unit 310 until a user is ready to dispense purified fluid F' to a point of use.

Figure 4:
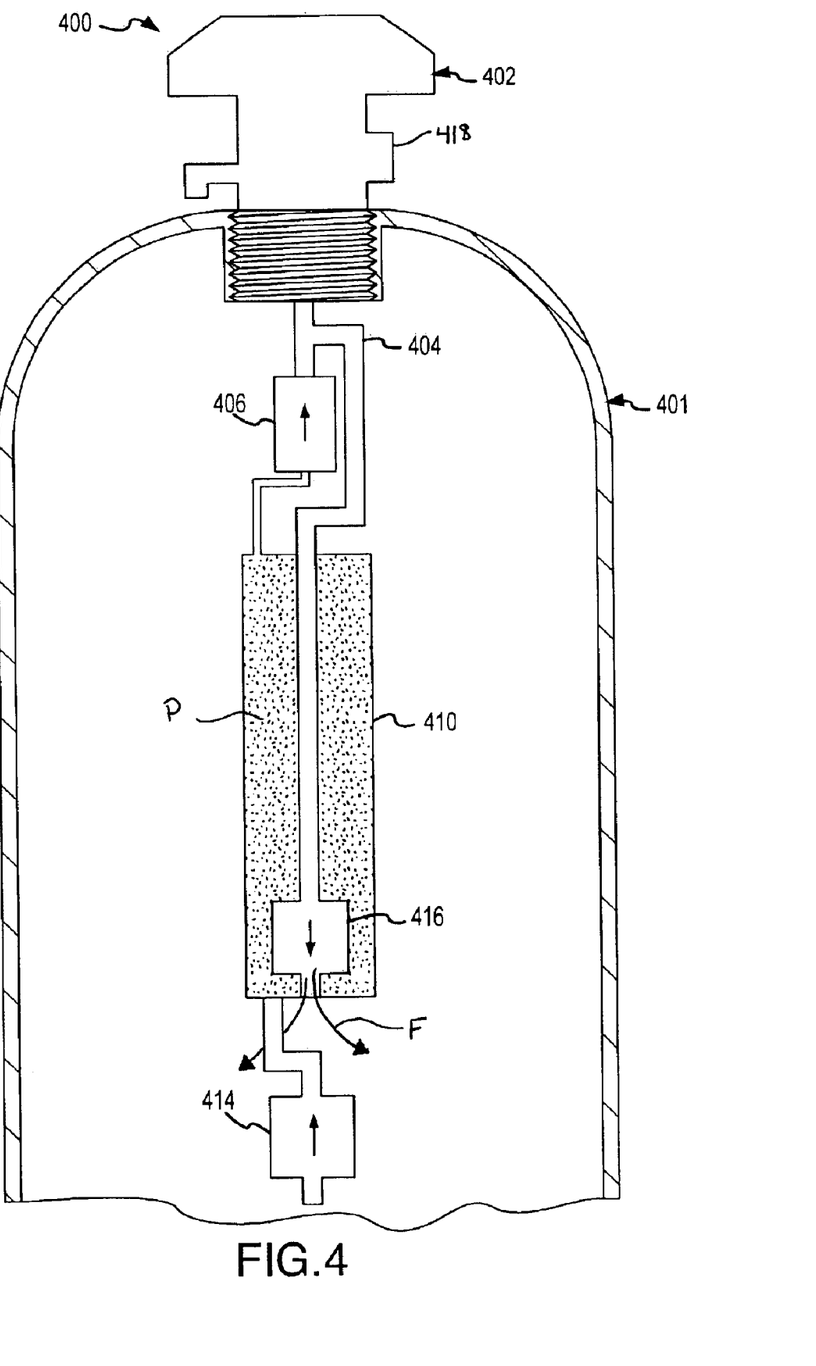
FIG. 4 shows a fluid purification apparatus 400 according to another embodiment of the invention.

Another embodiment of a fluid purifying apparatus 400 of the invention is illustrated by FIG. 4 and comprises a branched manifold 404 that is positioned inside a fluid storage vessel 401 and operatively engaged to a vessel valve 402 that receives fluids F and dispenses fluids F' from storage vessel 401. In this embodiment, fluid F introduced to vessel 401 travels through a port 418 aligned co-axially with purifier unit 410 and passes through a check valve 416 that is positioned inside purifier unit 410 before entering storage vessel 401. The walls of port 418 and check valve 416 are leak-tightly sealed to prevent fluid F from contacting the purifier material P of the purifier unit 410. When a user is ready to dispense purified fluid F' from vessel 401, fluid F stored in the vessel 401 passes through check valve 414 and into purifier unit 410 where the purifier material P removes impurities from the fluid F. After the impurities are removed, the purified fluid F' passes through check valve 406 into manifold 404 where it can be dispensed through open valve 402 to a point of use.

Similar to other embodiments of the invention, the purification apparatus 400 can include filter gaskets (not shown) to prevent particulate materials from entering purifier unit 410 and chamber 404 while also holding purifier materials P inside the purifier unit 410. Likewise, the purifier apparatus 400 also optionally includes burst disks (not shown) that leak-tightly seal purifier unit 410 until a user is ready to dispense purified fluid F' to a point of use.

Figure 5:
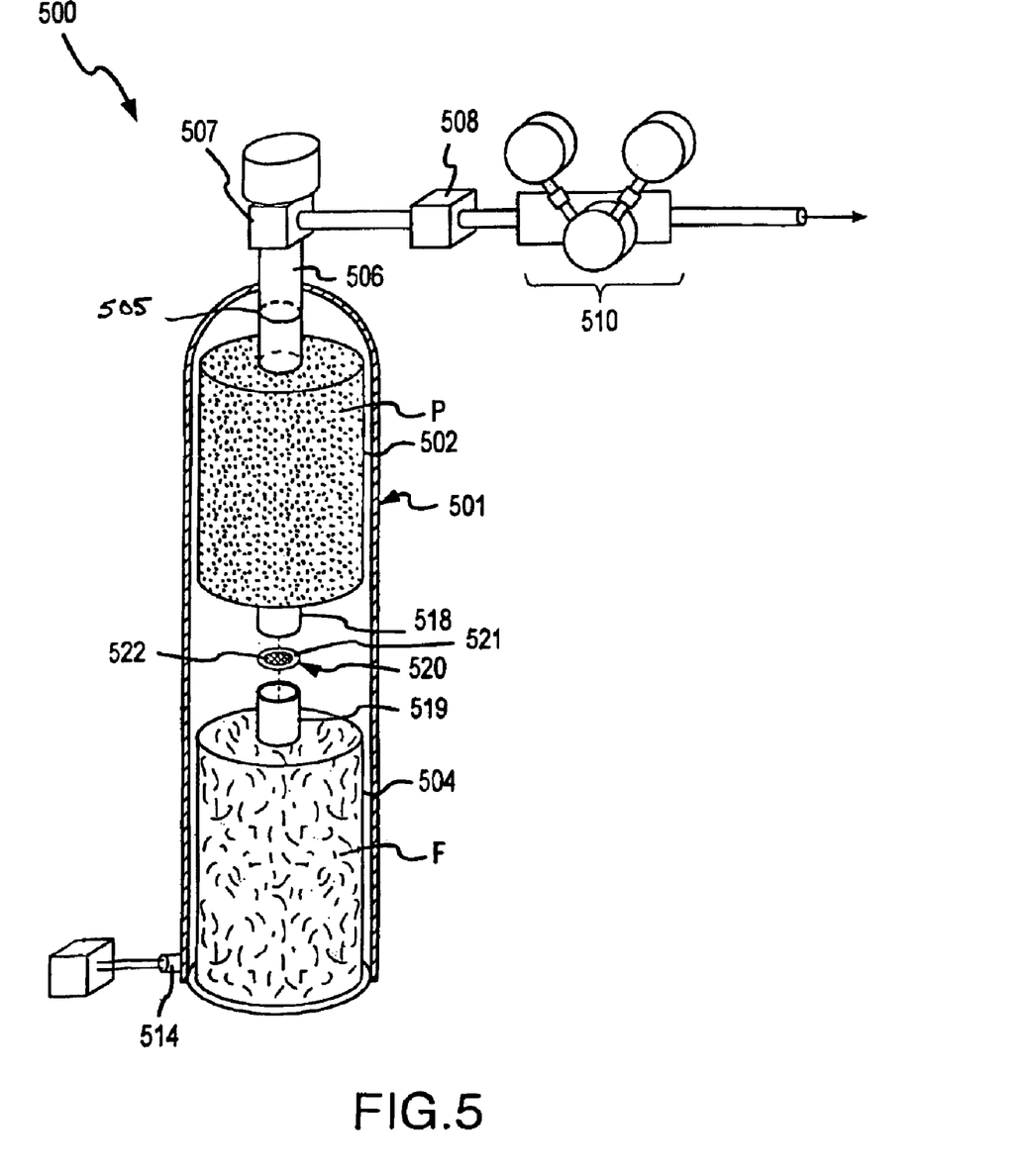
FIG. 5 shows a fluid purification apparatus 500 according to another embodiment of the invention.

Another embodiment of a fluid purifying apparatus 500 of the invention is illustrated by FIG. 5 and comprises a first container 502 operatively engaged with a second container 504, where both containers 502 and 504 are positioned inside a storage vessel 501. In this embodiment, fluid F and purifier material P are stored separately from each other in storage vessel 501 until a user is ready to deliver purified fluid F' to a point of use.

The first container 502 contains a purifier material P and the second container 504 contains a fluid F. First container 502 also has a first fitting 518 that is coupled to a second fitting 519 on second container 504. The fittings 518 and 519 can be, for example, VCR type fittings or threaded fittings that threadably engage the containers 502 and 504 in a leak-tight coupling.

A seal member 520 is co-axially aligned with and positioned between the fittings 518 and 519. Seal member 520 includes an outer ring portion 521 that engages the sealing faces of the first and second fittings 518 and 519 to form a leak-tight seal. The outer ring portion 521 can be made from a malleable metal or metal alloy. Alternatively, the outer ring portion 521 comprises an organic polymer such as plastic or rubber.

Seal member 520 also includes a rupturable inner membrane 522 to prevent fluid F from contacting purifier material P until the inner membrane 522 is ruptured. Seal member 520 is sealably engaged between first and second fitting 518 and 519 and fluid F is kept separate from purifier material P by the unruptured inner membrane 522. When a user is ready to contact fluid F with the purifier material P, the first container 502 can be pressurized until the inner membrane 522 ruptures. Alternatively, fluid F can rupture inner membrane 522 after the vessel valve 507 is opened, or the second container 504 can be pressurized through port 514 to cause the inner membrane 522 to rupture. Once the inner membrane 522 is ruptured, fluid F in second container 504 passes to first container 502 where impurities are removed from the fluid F by purifier material P, and the purified fluid F' is dispensed through open valve 507.

First container 502 has a port 505 that is coupled to a port 506 of storage vessel 501. The port 505 and port 506 are reversibly and leak-tightly coupled. Alternatively, port 505 and port 506 are welded together, or the port 505 is replaced by an opening in container 502 that is leak-tightly coupled to port 506. A filter gasket (not shown) covers the end of port 505 to prevent purifier material P and other particulates from clogging valve 507 and other downstream components of purifying apparatus 500.

The downstream components operatively engaging valve 507 include fitting 508 that leak-tightly couples valve 507 with fluid regulator 510. Optionally, valve 507 is also operatively engaged with shutoff valves (not shown), flow control devices (not shown), and filter and/or purifier units (not shown) downstream from valve 507.

A user can provide fluid F and purifier materials P to storage vessel 501 through valve 507 and/or port 514. The user can evacuate storage vessel 501 before adding fluid F and purifier materials P. The fluid F and purifier materials P can be loaded separately into vessel 501, or simultaneously introduced as a mixture.

Figure 6:
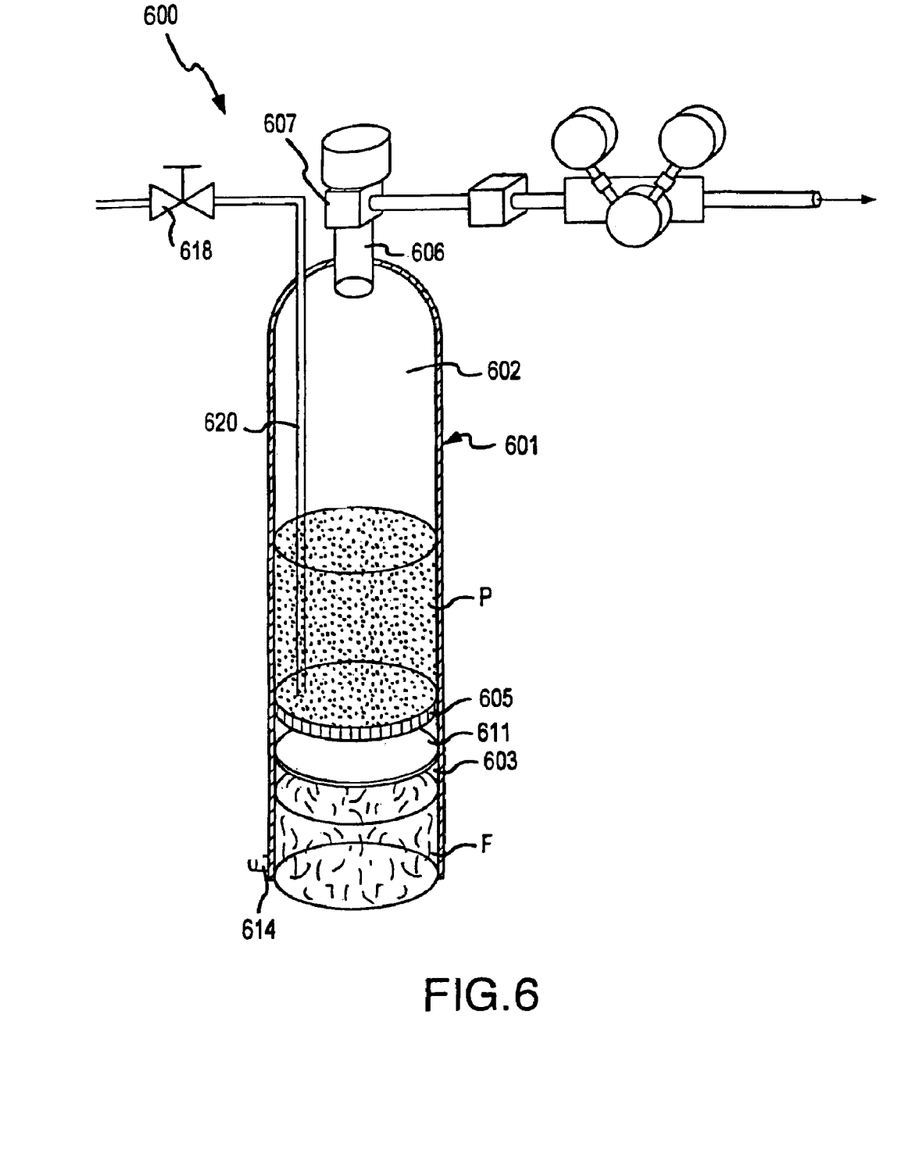
FIG. 6 shows a fluid purification apparatus 600 according to another embodiment of the invention.

Another embodiment of a purifying apparatus 600 according to the present invention is illustrated in FIG. 6 and comprises a storage vessel 601 that has an interior divided into a first and second compartment 602 and 603 by a fluid permeable support 605. The vessel 601 also has a rupturable membrane 611 positioned between fluid F and fluid permeable support 605. Rupturable membrane 611 prevents fluid F from contacting fluid permeable support 605 until rupturable membrane 611 is ruptured. Rupturable membrane 611 is made from a metal or polymer, such as a halogenated polymer like polytetrafluoroethylene (i.e., Teflon). Alternatively, rupturable membrane 611 is made from a metal foil, where the metal can include, without being limited to, gold, silver, nickel, aluminum, stainless steel, and alloys thereof.

The first compartment 602 holds the purifier materials P. Alternatively, purifier materials can be held in compartment 603 and fluid F held in compartment 602, or fluid F and/or purifier P can be held in both first and second compartments 602 and 603. A user introduces fluid F to the compartment 603 of storage vessel 601 by opening shutoff valve 618 that is coupled to conduit 620 that penetrates the fluid permeable support 605 and membrane 611. Alternatively, a user can introduce fluid F to the compartment 603 through port 614, or to compartment 602 through valve 607.

When the user is ready to supply fluid F stored in storage vessel 601 to a point of use, valve 607 is opened. Fluid F passes through fluid permeable support 605 and comes into contact with purifier material P that removes impurities from the fluid F. After the impurities are removed, the purified fluid F' passes through port 606, valve 607 and any other downstream components before reaching its point of use. Optionally, a filter gasket (not shown) covers the vessel-side opening of port 606 to prevent particulates and purifier materials from clogging valve 607 and other downstream components.

Figure 7:
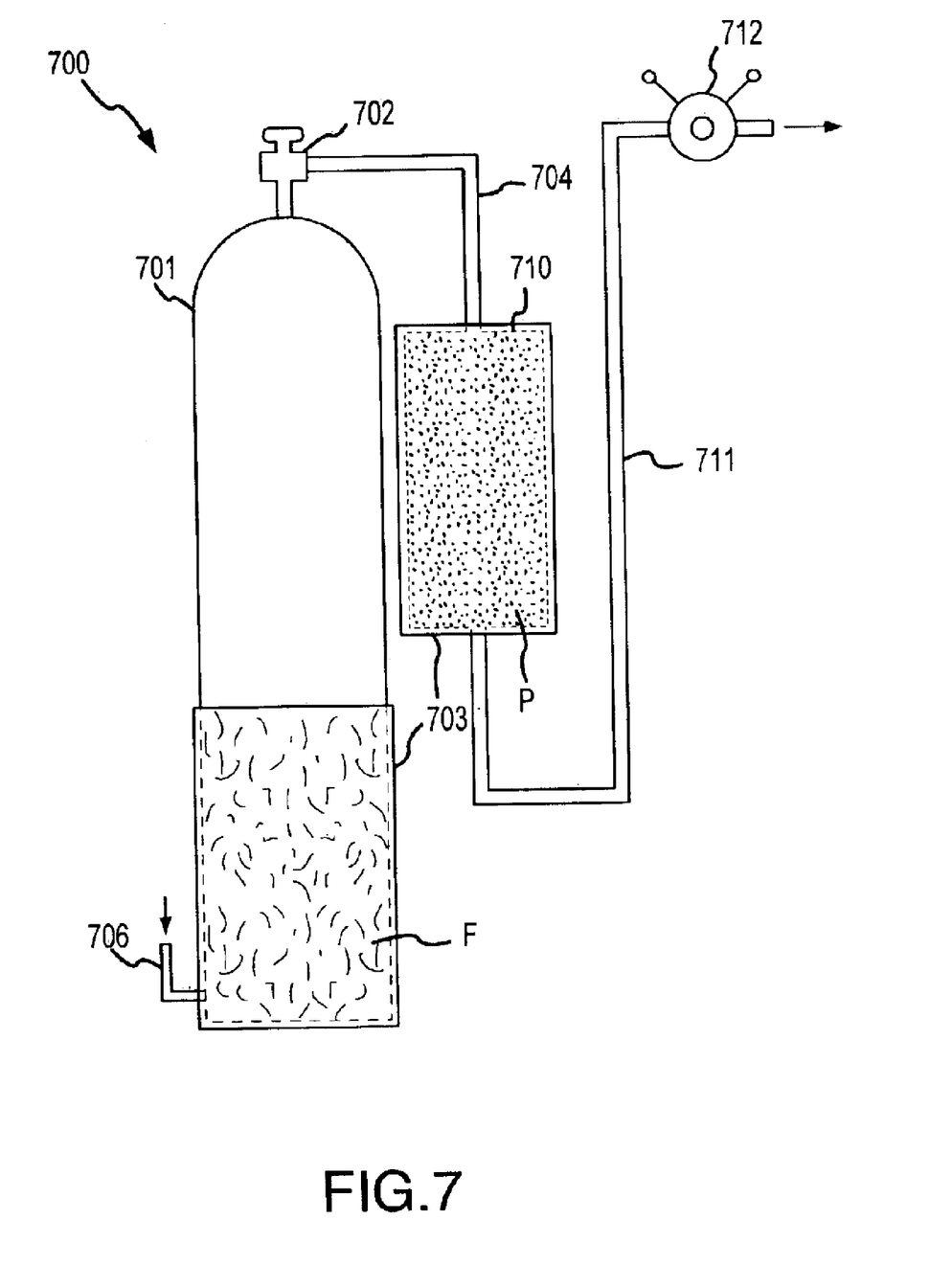
FIG. 7 shows a fluid storage and purification apparatus 700 according to another embodiment of the invention.

Another embodiment of a purifying apparatus 700 according to the present invention is illustrated in FIG. 7 and comprises a storage vessel 701 operatively engaged with a purifying unit 710. In this embodiment, purifier unit 710 is positioned outside storage vessel 701 and at least one temperature control device 703 is coupled to purifier unit 710 and/or vessel 701.

A user introduces fluid F to apparatus 700 by loading fluid F through port 706 that is coupled to vessel 701. Alternatively, a user can introduce fluid F to storage vessel 701 through valve 702. When a user is ready to dispense purified fluid F to a point of use, valve 702 is opened and fluid F passes through valve 702 and conduit 704 before entering the purifier unit 710 where purifier material P removes the impurities from fluid F. After the impurities are removed, the purified fluid F' passes through conduit 711 and onto the point of use. A regulator 712 is coupled to conduit 711 to regulate the pressure of fluid F reaching the point of use. Filter gaskets (not shown) can be coupled to the ends of purifier unit 710 to prevent particulate materials from entering purifier unit 710 and conduit 711 while also holding purifier materials P inside the unit 710.

The temperature of storage vessel 701 and purifier unit 710 are controlled during the operation of apparatus 700 by a temperature control device 703. Examples of the temperature control device 703 include, without being limited to, heating tape, heating plates, heating coils, heating pads, heated or refrigerated cabinets, and baths of temperature controlled fluids, among others.

Two or more, independently controllable temperature control devices can be coupled to apparatus 700 that independently control the temperature of different components of the apparatus 700. For example, one temperature control device can be coupled to storage vessel 701 while another temperature control device is coupled to purifier unit 710. In this configuration, storage vessel 701 and purifier unit 710 can operate at different temperatures as fluid F' is dispensed to a point of use.

Figure 8:
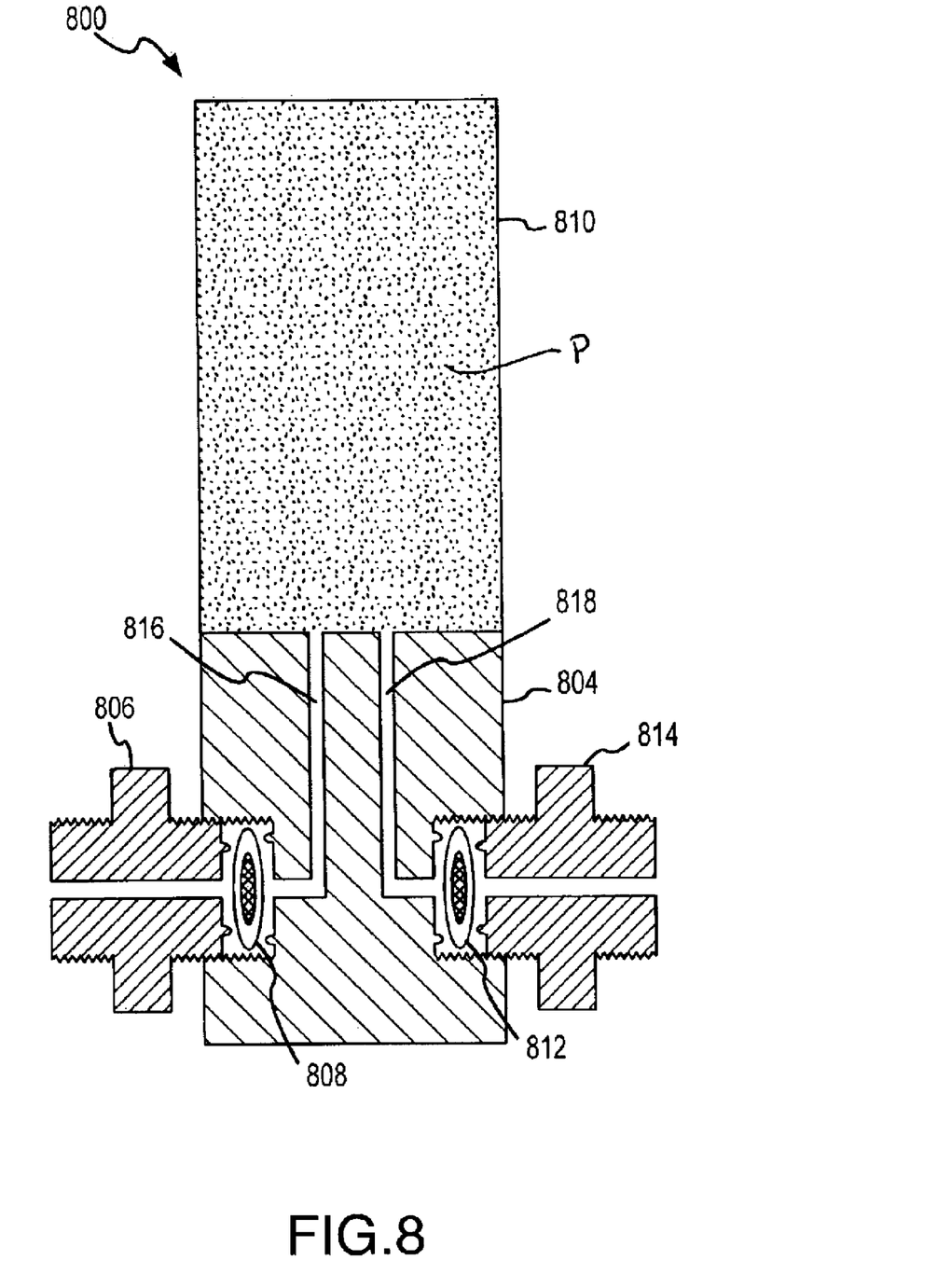
FIG. 8 shows a purifier unit 800 according to another embodiment of the invention.

Another embodiment of the invention is focused on a purifier unit 800 that is illustrated by FIG. 8. The purifier unit 800, which is coupled externally to a fluid vessel, comprises a container 810 coupled to a manifold 804 that is itself coupled to two unions 806 and 814. Fluid F from a source coupled to union 806 passes through union 806 and port 816 into container 810 that holds purifier material P. Impurities in fluid F are removed by purifier material P and purified fluid F' flows through port 818 and union 814 towards a point of use.

Burst disks 808 and 812 are positioned between the first and second union 806 and 814 and their respective openings in manifold 804. Burst disks 808 and 812 leak-tightly seal container 810, and prevent fluid F from contacting purifier material P until burst disk 808 is ruptured. Burst disks 808 and 812 include an outer ring portion and a rupturable inner membrane: The outer ring portion engages the sealing faces of unions 806 and 814 and manifold 804. Alternatively, burst disks 808 and 812 can be coupled to the unions 806 and 814 by, for example, adhesives, welding, electroplating, or mechanical friction fitting, among other techniques. The outer ring can be made from a metal or an organic polymer, among other materials, as can the rupturable inner membrane.

Filter gaskets can be positioned between unions 806 and 814 and manifold 804 to prevent particulate materials from entering container 810 while also holding purifier materials P inside the container 810.

Other embodiments of purifier unit 800 are contemplated where manifold 804 has male openings (not shown) that can couple to female unions (not shown). In another embodiment, burst gaskets may be sealingly inserted inside the unions.

The present invention also includes methods of purifying a fluid F. One method of removing an impurity from a fluid F comprises mixing the fluid F with a carrier gas in the interior compartment of a vessel, passing the mixture of fluid F and carrier gas through a purifier unit inside the vessel to purify the mixture and dispensing the purified mixture to a point of use.

Another method of purifying a fluid F containing impurities comprises storing fluid F in a vessel comprising an interior compartment and a purifier material P contained therein, wherein purifier material P comprises a metal compound formed on a substrate. The method also comprises flowing a carrier gas through the interior compartment of the vessel and dispensing a mixture of carrier gas and purified fluid F to a point of use. In addition, the method comprises evacuating a port coupled to a point of use and the vessel, and passing purified fluid F' from the vessel to the port.

In another method, a vessel is prepared to accept purifier materials P by removing substantially all impurities from an interior compartment of the vessel and then supplying the vessel with purifier materials P through a port coupled to the vessel. The port can be the same port used to dispense the purified fluid F'. After purifier material P is supplied to the port, a fluid F is added to the vessel. Alternatively, fluid F and purifier materials P may be added simultaneously to the vessel as a mixture.

Another method includes dispensing a purified fluid F' from an apparatus comprising: Providing a vessel with an interior compartment that comprises a purifier material P, wherein purifier material P comprises a metal deposited onto a substrate; and flowing a carrier gas through the vessel to remove purified fluid F' from the purifier and dispensing from the vessel a mixture of purified fluid F' and carrier gas, wherein the purified fluid F' dispensed from the vessel has impurity concentrations of about 100 parts per billion (ppb) or less.

Still another method of removing an impurity from a fluid F comprises providing a vessel comprising a first interior compartment and a second interior compartment, wherein the first interior compartment is separated from the second interior compartment by a fluid permeable support, providing a purifier material P in the first interior compartment and a fluid F in the second interior compartment, and passing fluid F through the fluid permeable support and purifying material P to remove impurities from the fluid F.

The foregoing description is considered as illustrative only of the principles of the invention. The words "comprise," "comprising," "include," "including," and "includes" when used in this specification and in the following claims are intended to specify the presence of one or more stated features, integers, components, or steps, but they do not preclude the presence or addition of one or more other features, integers, components, steps, or groups thereof. Furthermore, since a number of modifications and changes will readily occur to those skilled in the art, it is not desired to limit the invention to the exact construction and process shown described above. Accordingly, all suitable modifications and equivalents may be resorted to falling within the scope of the invention as defined by the claims that follow.

We claim:

1. A method of purifying a fluid comprising:
   providing a vessel comprising a first compartment and a second compartment, wherein the first compartment is separated from the second compartment by a fluid permeable support;
   providing a purifier in the first compartment and a fluid in the second compartment;
   breaking a membrane that prevents the fluid from contacting the purifier; and
   passing the fluid through the fluid permeable support and the purifier to remove impurities from the fluid.

2. The method of claim 1, wherein the membrane comprises metal or polymer.

3. The method of claim 1, wherein the fluid permeable support comprises a ceramic frit, a perforated metal disc, or a porous polymer.

4. The method of claim 1, wherein the vessel comprises a fluid storage cylinder.

5. The method of claim 1, wherein the purifier material comprises a substrate.

6. The method of claim 5, wherein the purifier material comprises a metal compound on the substrate.

7. The method of claim 6, wherein the metal compound comprises aluminum, magnesium, titanium, zirconium, vanadium, chromium, molybdenum, tungsten, manganese, zinc, lithium, sodium, lead, bismuth, cobalt, cerium, nickel, copper or iron.

8. The method of claim 5, wherein the substrate comprises alumina, silicon oxide, zeolite, aluminosilicate, zirconium oxide, carbon, polymers, or titanium oxide.

9. The method of claim 5, wherein a surface area for the substrate is from about 0.1 $m^2/g$ to about 1000 $m^2/g$.

10. The method of claim 5, wherein a surface area for the substrate is from about 10 $m^2/g$ to about 100 $m^2/g$.

11. The method of claim 5, wherein a pore size for the substrate is equal to or greater than about 0.1 nm.

12. The method of claim 5, wherein a pore size for the substrate is equal to or greater than about 2 nm.

13. The method of claim 1, wherein the fluid comprises an organometallic compound.

14. The method of claim 13, wherein the organometallic compound comprises one or more alkyl groups.

15. The method of claim 13, wherein the organometallic compound comprises a group IIa, IIb, IIIb, IVb, Vb, or VIb metal.

16. The method of claim 15, wherein said group IIa, IIb, IIIb, IVb, Vb, and VIb metal comprises aluminum, gallium, germanium, tin, phosphorous, nitrogen, arsenic, antimony, sulfur, selenium, tellurium, magnesium, zinc or indium.

17. The method of claim 1, wherein said impurities comprise an oxygenated compound.

18. The method of claim 1, wherein said impurities comprise molecular oxygen, water, carbon monoxide, carbon dioxide, ethers, alcohols, alkoxides, metals, hydrides, metal hydrides, metal carbonyls, metal halides, hydrocarbons, organometallic oxides, or alkyletherate adducts.

19. The method of claim 1, comprising mixing the fluid with a carrier gas.

20. The method of claim 19, wherein said carrier gas comprises hydrogen, helium, argon or nitrogen.

21. The method of claim 1, comprising providing a temperature control device to set the temperature of the vessel.

22. The method of claim 1, wherein the vessel is substantially free of carbon sorbent material.

23. An apparatus for purifying a fluid, comprising:
    (a) a vessel comprising a first interior compartment and a second interior compartment, wherein the first interior compartment is separated from the second interior compartment by a fluid permeable support, wherein said first interior compartment is capable of containing a purifier material and said second interior compartment is capable of containing a fluid containing impurities; and
    (b) a membrane between said fluid and the fluid permeable support, wherein the membrane prevents the fluid from contacting said purifier material until the membrane is broken.

24. The apparatus of claim 23, wherein said purifier material comprises a metal compound deposited thereon.

25. The apparatus of claim 24, wherein said metal compound comprises reduced valent metal comprising aluminum, magnesium, titanium, zirconium, vanadium, chromium, molybdenum, tungsten, manganese, zinc, lithium, sodium, lead, bismuth, cobalt, cerium, nickel, copper or iron.

26. The apparatus of claim 24, wherein the metal compound comprises a metal hydride comprising aluminum, magnesium, titanium, zirconium, vanadium, chromium, molybdenum, tungsten, manganese, zinc, lithium, sodium, lead, bismuth, cobalt, cerium, nickel, copper or iron.

27. The apparatus of claim 24, wherein a pore size for said purifier material is equal to or greater than about 0.1 nm.

28. The apparatus of claim 23, wherein the membrane comprises metal or polymer.

29. The apparatus of claim 23, wherein the vessel comprises a fluid storage cylinder.

30. The apparatus of claim 23, wherein said purifier material comprises alumina, silicon oxide, zeolite, aluminosilicate, zirconium oxide, carbon, polymers or titanium oxide.

31. The apparatus of claim 23, wherein a surface area for said purifier material is from about 0.1 m²/g to about 1000 m²/g.

32. The apparatus of claim 23, wherein a surface area for said purifier material is from about 10 m²/g to about 100 m²/g.

33. The apparatus of claim 23, wherein a pore size for said purifier material is equal to or greater than about 2 nm.

34. The apparatus of claim 23, wherein the fluid comprises an organometallic compound.

35. The apparatus of claim 34, wherein the organometallic compound comprises one or more groups.

36. The apparatus of claim 34, wherein the organometallic compound comprises a group IIa, IIa, IIb, IIIb, IVb, Vb or VIb metal.

37. The apparatus of claim 36, wherein said group IIa, IIb, IIIb, IVb, Vb, and VIb metal comprises aluminum, gallium, germanium, tin, phosphorous, nitrogen, arsenic, antimony, sulfur, selenium, tellurium, magnesium, zinc or indium.

38. The apparatus of claim 34, wherein the organometallic compound comprises alkyl amine-alanes, metal alkyl hydrazines, and tertiary butyl phosphine, tri-methyl gallium, tri-methyl aluminum, or trimethyl indium.

39. The apparatus of claim 23, wherein said impurities comprise an oxygenated compound.

40. The apparatus of claim 23, wherein said impurities comprise molecular oxygen, water, carbon monoxide, carbon dioxide, ethers, alcohols, alkoxides, metals, hydrides, metal hydrides, metal carbonyls, metal halides, hydrocarbons, organometallic oxides, or alkyletherate adducts.

41. The apparatus of claim 23, comprising a carrier gas to transport the fluid out of the vessel.

42. The apparatus of claim 41, wherein said carrier gas comprises hydrogen, helium, argon or nitrogen.

43. The apparatus of claim 23, wherein the fluid permeable support comprises a ceramic frit, a perforated metal disc, or a porous polymer.

44. A fluid purifying apparatus comprising:
   a first container comprising a first fitting and a purifier material;
   a second container comprising a second fitting and a fluid to be purified; and
   a seal member interposed between the first fitting and the second fitting when the first container is coupled to the second container, wherein the seal member comprises an inner membrane that separates the fluid to be purified from the purifier material until the inner membrane is broken.

45. A fluid purifying apparatus comprising:
   a manifold comprising a first branch and a second branch;
   a first check valve coupled to the first branch of the manifold; and
   a purifier unit comprising a first end and a second end, wherein the first end is coupled to the second branch of the manifold.

46. The apparatus of claim 45, wherein said apparatus is positioned inside a fluid vessel comprising a valve.

47. The apparatus of claim 46, wherein said manifold is coupled to the valve.

48. The apparatus of claim 46, wherein said valve has a single port.

49. The apparatus of claim 45, comprising a second check valve coupled between the second branch of the manifold and the first end of the purifier unit.

50. The apparatus of claim 45, comprising a third check valve coupled to the second end of the purifier unit, wherein the second end is opposite the first end of the purifier unit.

51. The apparatus of claim 45, comprising a first and second filter gasket, wherein the first filter gasket is coupled to the first end of the purifier unit and the second filter gasket is coupled to the second end of the purifier unit.

52. The apparatus of claim 45, comprising a first and second burst disk, wherein the first burst disk is coupled to the first end of the purifier unit and the second burst disk is coupled to the second end of the purifier unit.

53. A fluid purifying apparatus comprising:
   a fluid vessel comprising a vessel valve;
   a purifier unit positioned outside of said fluid vessel, wherein said purifier unit comprises a first opening and a second opening, said first opening coupled to the vessel valve and said second opening coupled to a point of use for purified fluid; and
   a temperature control device thermally coupled to the vessel.

54. The apparatus of claim 53, comprising a second temperature control device coupled to the purifier unit.

55. The apparatus of claim 53, wherein the temperature control device is a constant temperature fluid bath, heating tape, or a temperature controlled gas cabinet.

56. The apparatus of claim 53, comprising a first and second burst disk, wherein the first burst disk is coupled to the first opening of the purifier unit and the second burst disk is coupled to the second opening of the purifier unit.

* * * * *